(12) United States Patent
Heightley

(10) Patent No.: US 7,474,136 B2
(45) Date of Patent: Jan. 6, 2009

(54) USE OF MULTIPLE VOLTAGE CONTROLLED DELAY LINES FOR PRECISE ALIGNMENT AND DUTY CYCLE CONTROL OF THE DATA OUTPUT OF A DDR MEMORY DEVICE

(75) Inventor: John D. Heightley, Colorado Springs, CO (US)

(73) Assignee: ProMOS Technologies Pte.Ltd., Singapore (SG)

( * ) Notice: Subject to any disclaimer, the term of this patent is extended or adjusted under 35 U.S.C. 154(b) by 66 days.

(21) Appl. No.: 11/745,911

(22) Filed: May 8, 2007

(65) Prior Publication Data

US 2008/0278211 A1  Nov. 13, 2008

(51) Int. Cl.
*H03K 3/017* (2006.01)
*H03K 5/04* (2006.01)
*H03K 7/08* (2006.01)

(52) U.S. Cl. ............... 327/175; 365/233.1; 365/233.13; 327/158; 327/161

(58) Field of Classification Search ............ 365/233.1, 365/233.13; 327/175, 158
See application file for complete search history.

(56) References Cited

U.S. PATENT DOCUMENTS

| 6,781,419 | B2 | 8/2004 | Harrison |
| 6,906,566 | B2* | 6/2005 | Drexler ................ 327/158 |
| 7,028,208 | B2 | 4/2006 | Johnson et al. |
| 7,071,745 | B2 | 7/2006 | Heightley et al. |
| 2006/0087354 | A1* | 4/2006 | Minzoni ................ 327/158 |

* cited by examiner

*Primary Examiner*—Tuan T. Lam
*Assistant Examiner*—Daniel Rojas
(74) *Attorney, Agent, or Firm*—William J. Kubida; Peter J. Meza; Hogan & Hartson LLP

(57) ABSTRACT

A DLL circuit uses a rising edge DLL to align the rising edge of the output data to the system clock and a falling edge DLL to align the falling edge of the output data. The DLL circuit does not use the falling edge of the input clock to provide a reference for the falling edge DLL. The DLL circuit uses the rising edge of a first reference clock (a buffered version of the input clock) to align the rising edge of the output data. An additional DLL is used to generate a precise second reference clock that is delayed by exactly one-half period of the first reference clock to align the falling edge of the output data. Any variation in the duty cycle of the input clock or the input clock buffer does not effect the duty cycle of the output data.

20 Claims, 6 Drawing Sheets

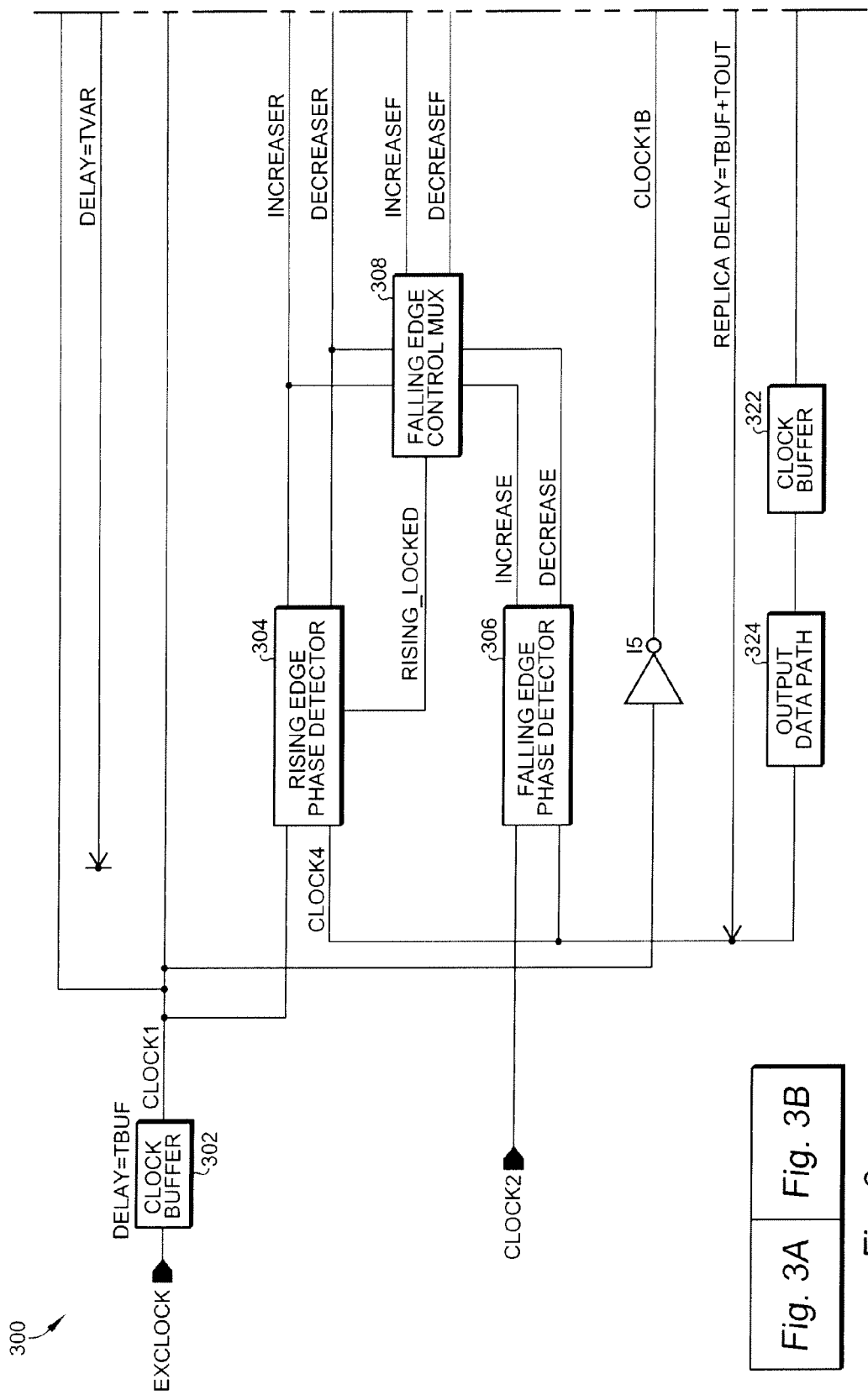

USE OF MULTIPLE VOLTAGE CONTROLLED DELAY LINES FOR PRECISE ALIGNMENT AND DUTY CYCLE CONTROL OF THE DATA OUTPUT OF A DDR MEMORY DEVICE

BACKGROUND OF THE INVENTION

The present invention is related to integrated circuit memories, and, more particularly, to a circuit for aligning both the rising and falling edges of data signals in DDR (Double Data Rate) integrated circuit memories.

As the frequency of DDR memories continues to increase, the precise alignment of both the rising edge and falling edge of the output data to the rising and falling edges of the system clock has become very critical since data must be captured by both edges of the clock. Delay Locked Loops (DLLs) have been used to adjust the timing of the output data such that it aligns with the system clock. Until recently, only the rising edge of the data has been aligned with the rising edge of the system clock by the DLL. Circuit techniques have been used to maintain the duty cycle of the output data at 50% so that the falling edge of the data will align with the falling edge of the 50% duty cycle system clock. FIG. 1 shows a typical Voltage Controlled DLL used in recent DDR memory devices.

The Voltage Controlled DLL 100 of FIG. 1 includes an input clock buffer 102, a phase detector 104, a variable delay line 106, a control voltage generator 108, a replica fixed delay line 110, and an output data path block 112.

Referring to FIG. 1, it can be seen that when the DLL is locked, the signals DLLCLK and SYNC at the input of phase detector 104 are in phase, which means that:

$$tvar = ntck - tfix, \text{ where } tck \text{ is the clock period.}$$

The delay between the external clock ExCLK and the data output is:

$$tbuf + tvar + tout = tbuf + (ntck - tfix) + tout.$$

If tfix=tbuf+tout, the delay between ExCLK and the data output is ntck, and the output data will be precisely aligned with the external clock. It is very difficult to have tfix precisely match tbuf+tout under all conditions unless an exact replica of the clock buffer and data output path are used to implement the fixed delay. In addition, since only the rising edge of SYNC is aligned with DLLCLK, any duty cycle distortion introduced by the clock buffer, variable delay, and output path will result in the falling edge data undesirably not being aligned with the falling edge of the system clock.

For double data rate outputs, data is output on the rising and falling edge of the system clock. In the discussion below, the term "rising edge" data refers to data that is output on the rising edge of the system clock. The term "falling edge" data refers to data that is output on the falling edge of the system clock.

FIG. 2 is a prior art DLL (U.S. Pat. No. 7,028,208 B2) that addresses most of the limitations of the DLL of FIG. 1. DLL 200 includes input buffers 202 and 204, a coarse delay line/phase detect block 206, a converter 208, fine delay line/phase detect blocks 210 and 212, converters 214 and 216, a clock driver 218, I/O model 220, a clock driver 218, data latch 222, and a data driver 224.

The circuit 200 of FIG. 2 has the goal of precisely aligning the rising and falling edge of the output data with the system clock signal, even if the clock signal is not precisely 50% duty cycle. If the clock is precisely 50% duty cycle, the intention is to have the output also be 50%.

However, circuit 200 of FIG. 2 has two major limitations.

Firstly, the two RX Buffers 202 and 204 must produce the reference clocks CLKIN− and CLKIN+ without introducing any duty cycle distortion relative to the input clocks since these are the references to which the outputs are effectively aligned by the fine DL/PD circuits. Since two separate buffers 202 and 204 are required to generate these references and they are responding to complementary input clock signals, it is inevitable that duty cycle distortion will be introduced in these reference signals with respect to each other. This distortion will show up in the output signal. If a single ended input clock signal were used and its rising and falling edges were the source of the reference signals, the input would still have to be buffered and distortion would again be introduced.

Secondly, the output of the "I/O Model" 220, which is the feedback signal, is converted into a rising edge signal (CLKFB+) and a falling edge signal (CLKFB−). If CLKIN+ and CLKIN− are perfect representations of the duty cycle of the input clocks, but the time between the rising edges of CLKFB+ and CLKFB− does not precisely track the high time of the output of the I/O Model 220, duty cycle distortion in the feedback signal not present in the output path will be introduced. The DLL 200 will remove the distortion in the feedback signal, but this effectively introduces distortion into the data out signal. It is inevitable that the circuit block, "CONVERTER" 216, will introduce duty cycle distortion.

What is desired, therefore, is a DLL circuit capable of effectively aligning both the rising edge and falling edge of data signals in a DDR memory, and without introducing undesirable duty cycle distortion.

SUMMARY OF THE INVENTION

According to the present invention, a DLL circuit uses a rising edge DLL to align the rising edge of the output data to the system clock and a falling edge DLL to align the falling edge of the output data to the falling edge of the system clock. However, the DLL circuit of the present invention does not use the falling edge of the input clock to provide a reference for the falling edge DLL. The circuit of the present invention uses the rising edge of a first reference clock (a buffered version of the input clock) to align the rising edge of the output data. An additional DLL is used to generate a precise second reference clock that is delayed by exactly one-half period of the first reference clock to align the falling edge of the output data. Thus, any variation in the duty cycle of the input clock or the input buffer does not effect the duty cycle of the output data.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 5(*b*) is a timing diagram showing the same timing signals of FIG. 5(*a*) after the DLLs are locked in accordance with the present invention.

DETAILED DESCRIPTION

Figure 1:
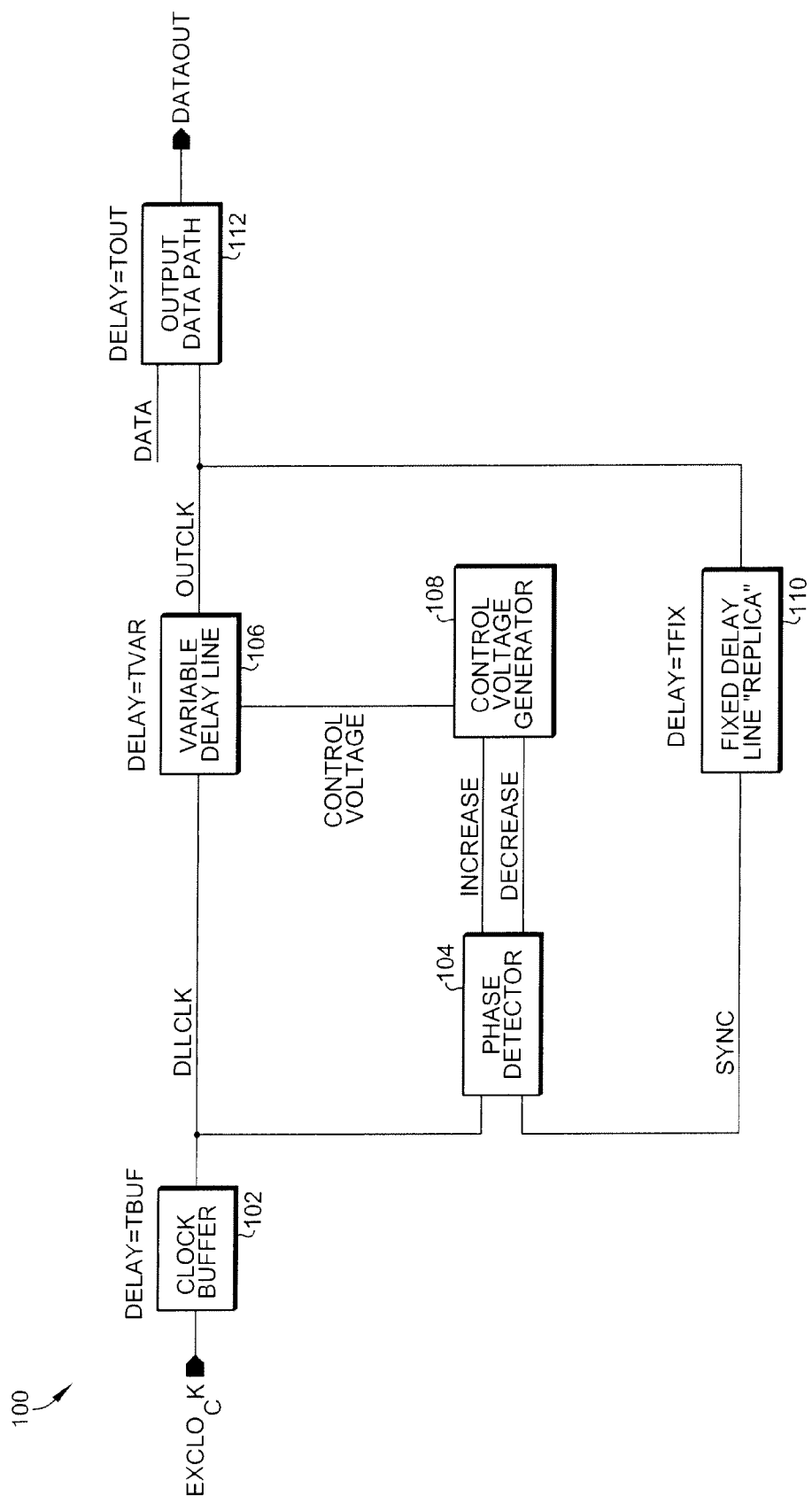
FIG. 1 is a schematic diagram of a prior art DLL circuit.
Figure 2:
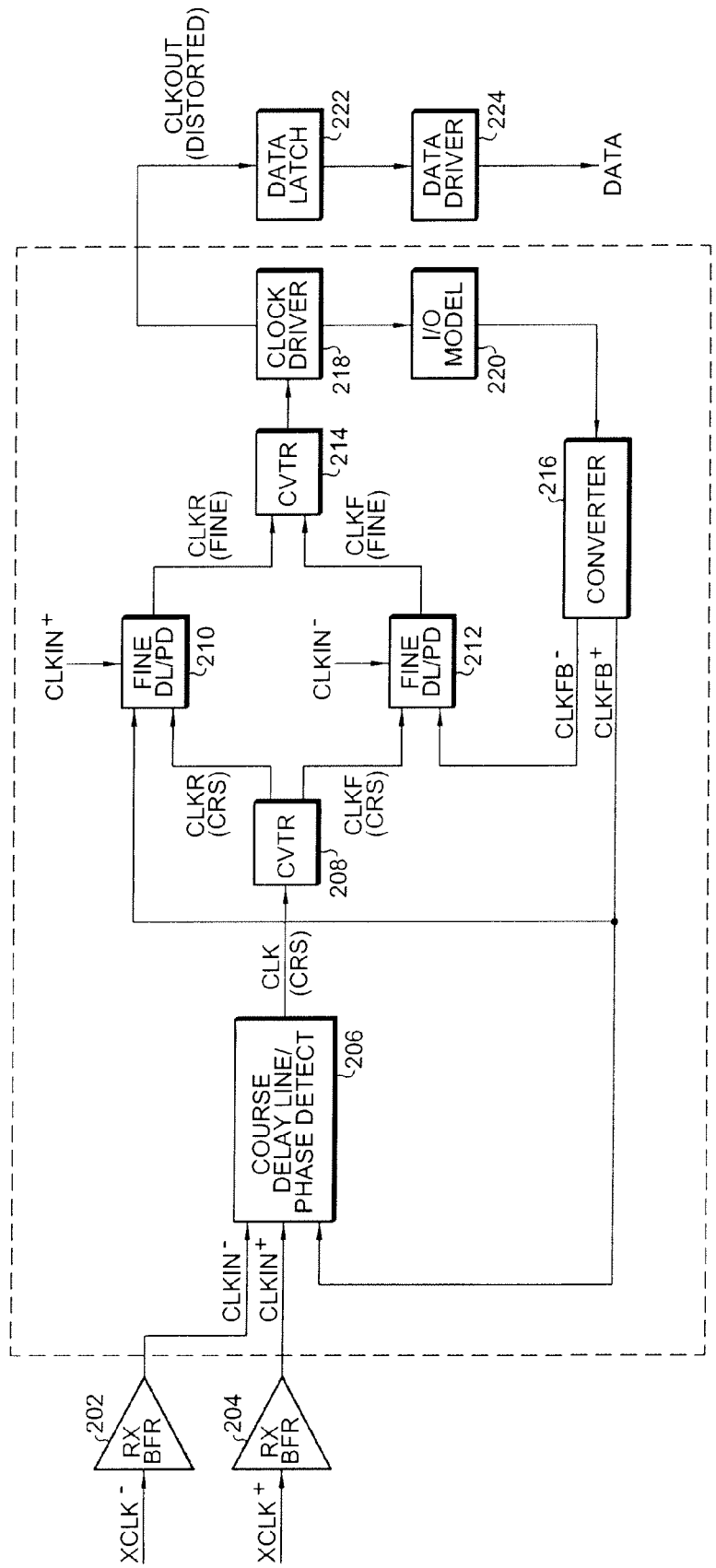
FIG. 2 is a schematic diagram of a prior art DLL circuit including circuitry for aligning the rising and falling edges of a data signal.
Figure 3B:
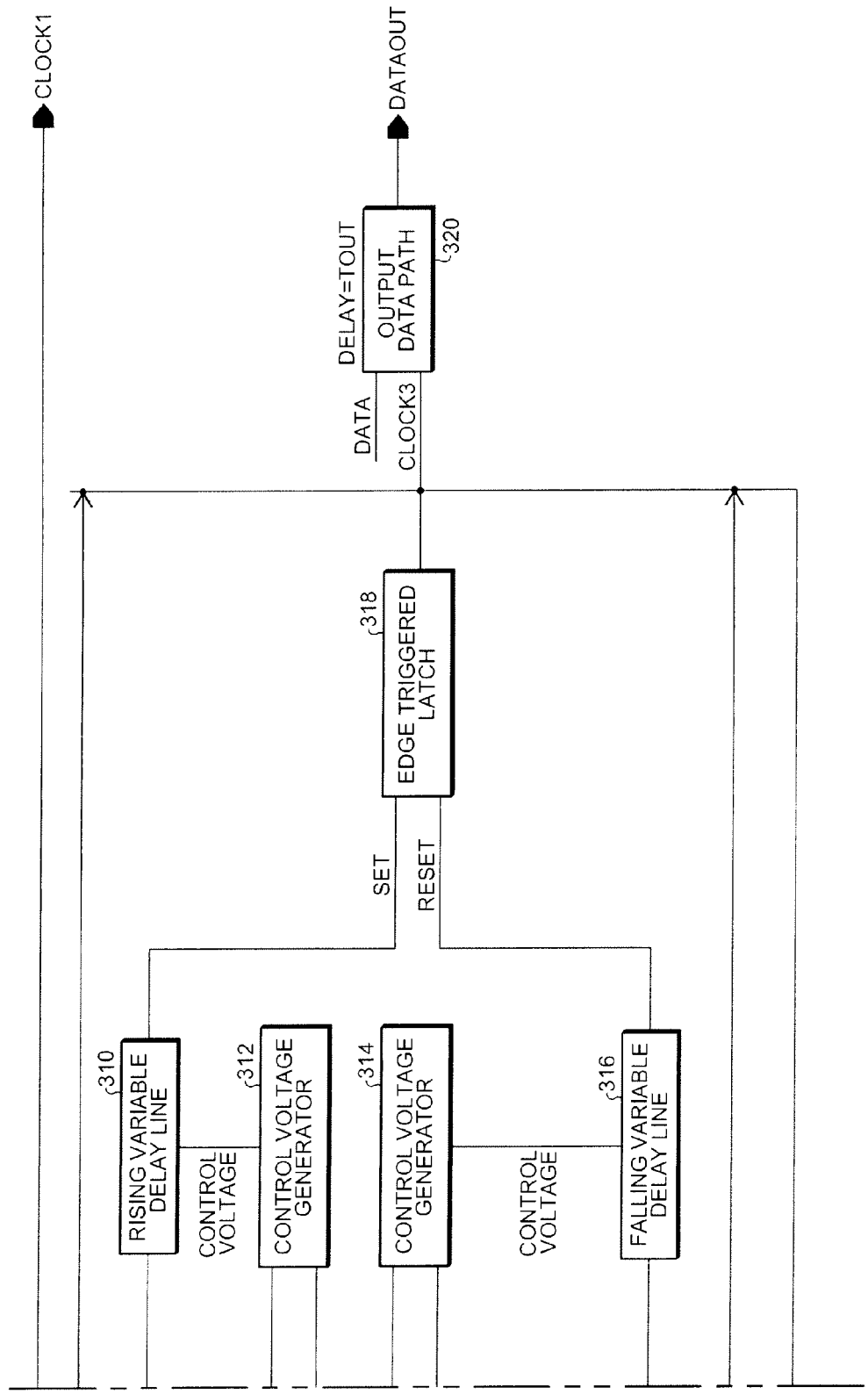
FIG. 3 is a schematic diagram of a DLL circuit including circuitry for aligning the rising and falling edges of a data signal according to the present invention.
Figure 4:
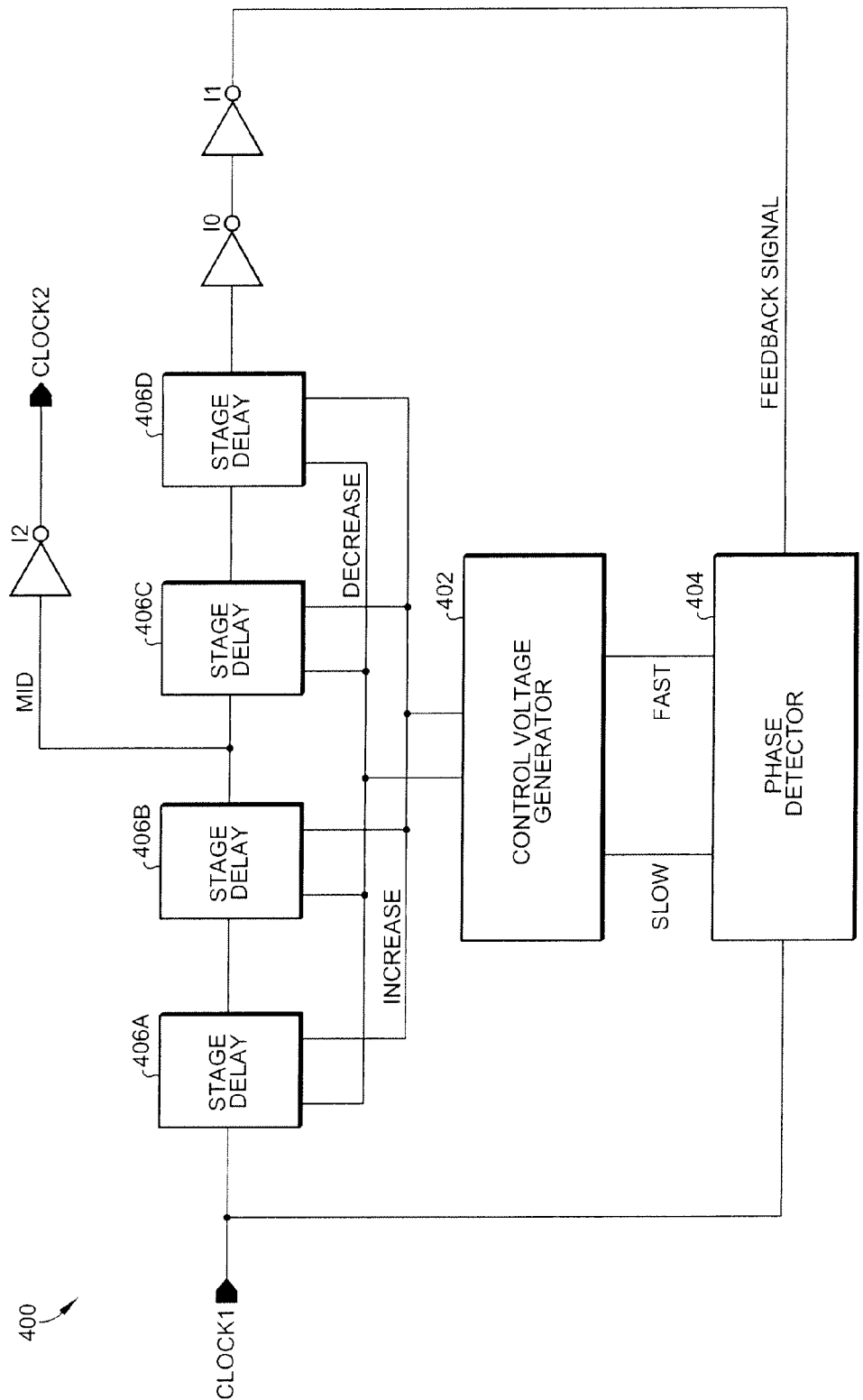
FIG. 4 is a schematic diagram of an additional DLL circuit that is used to generate a precise 50% duty cycle reference in accordance with the present invention.

FIG. 3 is a block diagram of the duty cycle correction circuit 300 and FIG. 4 is a block diagram of the precise reference generation circuit 400 according to an embodiment of the present invention.

Circuit 300 includes a clock buffer 302, a rising edge phase detector 304, a falling edge phase detector 306, a falling edge control multiplexer 308, a rising variable delay line 310, a control voltage generator 312, a control voltage generator 314, a falling variable delay line 316, an edge triggered latch 318, an output data path 320, a clock buffer 322 and an output data path 324. These circuit components, their functions and interaction are described in further detail below.

With respect to the duty cycle correction circuit 300 shown in FIG. 3, there are two voltage controlled variable delay line paths in the duty cycle correction circuit that have their delays independently controlled via two delay locked loops. One delay line receives the reference clock, (Clock1) as its input (the "rising edge delay line") and the other delay line (the "falling edge delay line") receives an inverted version of the reference clock as its input (Clock1B). The edge-triggered latch 318 generates the data output clock (Clock3). The rising edge of the data output clock is determined by the rising edge of the delayed version of Clock1, "Set," and the falling edge of the data output clock is determined by the rising edge of the delayed version of the inverted clock Clock1B, "Reset." Thus, the rising and falling edges of the data output clock can be adjusted independently by adjusting the delay through the two variable delay lines. Any duty cycle distortion introduced by the inverter in the falling edge path, the variable delay lines, or the latch is of no consequence since only the rising edges of the outputs of the two delay lines are utilized.

The rising edge phase detector 304 compares the phase of the rising edges of its two inputs and the falling edge phase detector 306 compares the phase of the falling edges of its two inputs. As will be seen below, the rising edge of Clock1 and the falling edge of Clock2 are separated by precisely one-half clock period of the input clock. The duty cycle of Clock4 will thus be precisely 50% since its rising and falling edges are aligned to signals separated by precisely one-half clock period. The DataOut duty cycle will be precisely 50% and aligned with the system clock to the extent that the feedback replica accurately represents the input buffer and the output data path.

Both delay lines are initialized with minimum possible delay and the delay is forced to increase even if the phase detector indicates the delay should be decreased until the first indication by the phase detector that the delay should be increased. From that point on, the delay is adjusted on the basis of the phase detector indications. The benefits of this approach are documented in prior art U.S. Pat. No. 7,071,745, which is hereby incorporated by reference. It is important to assure that neither phase detector 304, 306 issue a premature indication to decrease the delay of the respective delay lines, since this is not initially possible. U.S. Pat. No. 7,071,745 discusses how this may be accomplished in the case of the rising edge. In the case of the falling edge, the "Falling Edge Control Mux" 308 forces the falling edge path delay to be controlled by the rising edge phase detector until a locked rising edge condition is detected and the signal "Rising_Locked" is output from the rising edge phase detector 304. At that time, the "Falling Edge Control Mux" 308 switches and the falling edge phase detector controls the falling edge path. The signal "Rising_Locked" occurs after one or more indications to increase delay are followed by an indication to decrease delay or neither of these indications occurs for a fixed period of time set by an internal timer.

An additional voltage controlled delay DLL 400 is used to generate a precise 50% duty cycle reference in accordance with this invention as shown in FIG. 4. Circuit 400 includes a control voltage generator 402, a phase detector 404, and stage delay stages 406A, 406B, 406C, and 406D. These circuit components, their functions and interaction are described in further detail below.

The signal Clock1 is the same signal as shown in FIG. 3 and does not have to have a precise duty cycle. A four-stage voltage controlled delay line 406A-406D is shown for illustration. Any even number of delay stages can be used with the signal "Mid" taken at the mid-point. The delay of the delay line is initialized at its minimum possible delay and the delay between Clock1 and the Feedback Signal must be less than one clock period of the signal that is to have its duty cycle adjusted. The delay through the delay line must only increase initially. The first requirement is achieved simply by the design of the "Delay Stage" and by properly selecting the number of stages in the delay line. U.S. Pat. No. 7,071,745 describes a method for forcing the delay to only increase initially.

According to the present invention, the reference generator of FIG. 4 provides a DLL locked condition with a delay equal to a single period of Clock1 (Tck) between the rising edges of signals Clock1 and the Feedback Signal. Thus, when the DLL is locked, the delay from the rising edge of Clock1 to the rising edge of the Feedback Signal will be precisely Tck.

If the delay per stage of the reference generator 400 in FIG. 4 when the DLL is locked is DELTA and the delay of the inverters is INV, then the delay from the rising edge of Clock1 to the falling edge of Clock2 is:

Delay(Clock2)=2*DELTA+*INV*

Since the delay between Clock1 and the Feedback Signal is one clock period of Clock1 (Tck), DELTA=(Tck−2*INV)/4, and the delay of the falling edge of Clock2 becomes:

Delay(Clock2)=2*(*Tck*−2**INV*)/4+*INV* or:

Delay(Clock2)=*Tck*/2.

As stated above, any even number of delay stages 406A-406D can be used in the delay line as long as the initial delay is less than Tck.

Referring again to FIG. 3, using Clock1 as the rising edge reference and Clock2 from the reference generator of FIG. 4 as the falling edge reference, the signal Clock4 will have precisely a 50% duty cycle when the rising and falling edge DLLs are locked. To the extent the replica clock buffer and output path reflect the true clock buffer and output path, the output will have a 50% duty cycle, and will be aligned with the system clock.

Figure 5:
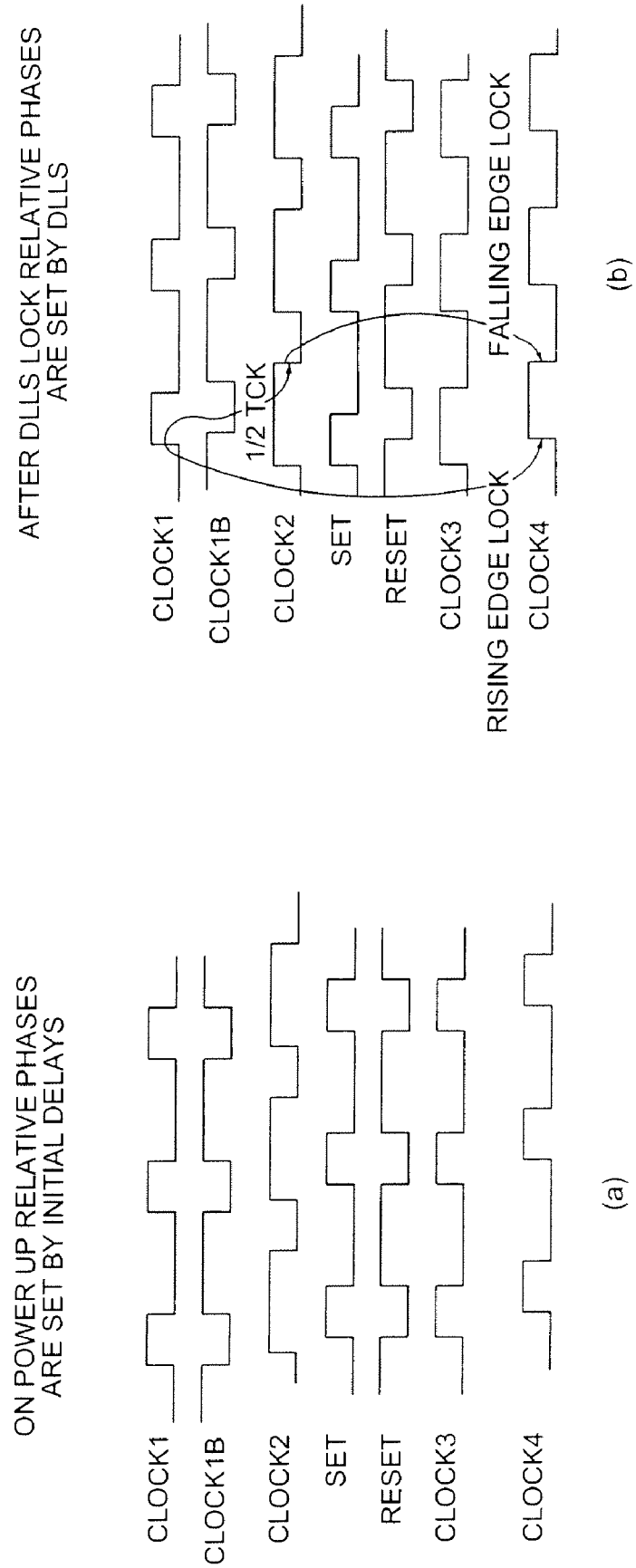
FIG. 5(*a*) is a timing diagram showing various timing signals before the DLLs lock in accordance with the present invention.

FIG. 5 illustrates the phase relationships of the various signals named in FIG. 3 before and after the DLLs lock. FIG. 5(*a*) shows the phase relationships at power-up, before any of the three DLLs have made any adjustments to the delay through any of the respective delay lines. The phase relationships and the duty cycle shown are arbitrary and have been selected only for illustrative purposes. FIG. 5(*b*) shows the phase relationships after all three DLLs have locked. The process of arriving at the conditions shown in FIG. 5(b) is described below.

After the DLL shown in FIG. 4 has locked, the falling edge of Clock2 is delayed precisely one-half Tck from the rising edge of Clock1 as is illustrated in FIG. 5(b).

The delay through delay line 310 of FIG. 3 has been adjusted and the signal Set has established the timing of the rising edge of Clock3. The timing of the rising edge of Clock3 has been adjusted such that, after passing through the "Replica Delay", the rising edge of Clock4 is precisely aligned with the rising edge of Clock1 as is shown in FIG. 5(b).

The delay through delay line 316 of FIG. 3 has been adjusted and the signal Reset has established the timing of the falling edge of Clock3. The timing of the falling edge of Clock3 has been adjusted such that, after passing through the "Replica Delay", the falling edge of Clock4 is precisely aligned with the falling edge of Clock2 as is shown in FIG. 5(b).

While there have been described above the principles of the present invention in conjunction with specific circuit designs and methods of operation, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicant hereby reserves the right to formulate new claims to such features and/or combinations of such features during the prosecution of the present application or of any further application derived therefrom.

I claim:

1. A three DLL circuit for assuring a 50% duty cycle of an output data signal of a DDR memory comprising:
   a first clock signal;
   a first delay locked loop including a first voltage controlled delay line, a first phase detector and a first feedback signal for generating a second clock signal from the first clock signal;
   a second delay locked loop including a second voltage controlled delay line and second phase detector for adjusting one transition of the DDR output data signal;
   a third delay locked loop including a third voltage controlled delay line and third phase detector for adjusting a second transition of the DDR output data signal;
   a third clock signal with rising and falling edges generated by the rising edges of the second and third delay line outputs, respectively, for enabling the DDR output data signal; and
   a fourth clock signal generated by delaying the third clock signal by a fixed delay and feeding it back as an input to the second and third phase detectors of the second and third delay locked loops.

2. The circuit of claim 1 wherein the falling edge of the second clock signal is one-half clock period later than the rising edge of the first reference clock.

3. The circuit of claim 1 wherein the fixed delay in the path between the third clock signal and the fourth clock signal is a replica of a clock input buffer and an output data path of the DDR memory.

4. The circuit of claim 1 wherein the delay through the first, second and third delay lines is forced to increase independent of the phase of the respective inputs to the first, second and third phase detectors until the output of the respective phase detectors indicates the delay needs to be increased.

5. The circuit of claim 1 wherein outputs of the second phase detector and the third phase detector are multiplexed to provide control signals to control the delay of the third voltage controlled delay line.

6. The circuit of claim 5 wherein signals to control the delay of the third delay line are selected by an output of the second phase detector indicating whether the rising edges of the first reference clock and the fourth clock signal are locked or not locked.

7. The circuit of claim 6 wherein an indication that the rising edges of the first reference signal and the fourth clock signal are locked is indicated by either an output sequence from the second phase detector first indicating a need to increase delay followed by a subsequent indication of a need to decrease delay or, neither indication occurs within a preset period of time.

8. The circuit of claim 1 wherein the third clock signal is generated by an edge triggered latch.

9. The circuit of claim 1 wherein the first delay line comprises an even number of delay stages.

10. The circuit of claim 1 wherein an initial delay from the first clock signal to the first feedback signal is less than one period of the first clock signal.

11. The circuit of claim 1 wherein the delay from the first clock signal to the first feedback signal is equal to the period of the first clock signal when the first delay locked loop is locked.

12. A three DLL circuit for assuring a 50% duty cycle of an output data signal of a DDR memory comprising:
   a first clock signal;
   a first delay locked loop for generating a second clock signal from the first clock signal;
   a second delay locked loop for adjusting one transition of the DDR output data signal;
   a third delay locked loop for adjusting a second transition of the DDR output data signal;
   a third clock signal with rising and falling edges generated by the rising edges of the second and third delay line outputs, respectively, for enabling the DDR output data signal; and
   a fourth clock signal generated by delaying the third clock signal by a fixed delay and feeding it back as an input to the second and third phase detectors of the second and third delay locked loops.

13. The circuit of claim 12 wherein the first delay locked loop includes a first voltage controlled delay line, a first phase detector and a first feedback signal.

14. The circuit of claim 12 wherein the second delay locked loop includes a second voltage controlled delay line and second phase detector.

15. The circuit of claim 12 wherein the third delay locked loop includes a third voltage controlled delay line and third phase detector.

16. A DLL circuit comprising:
   a first clock signal;
   a first delay locked loop for generating a second clock signal from the first clock signal;

a second delay locked loop for adjusting one transition of an output data signal;

a third delay locked loop for adjusting a second transition of the output data signal;

a third clock signal with rising and falling edges generated by the rising edges of the second and third delay line outputs, respectively, for enabling the output data signal; and a fourth clock signal generated by delaying the third clock signal by a fixed delay and feeding it back as an input to the second and third phase detectors of the second and third delay locked loops.

17. The circuit of claim 16 wherein the first delay locked loop includes a first voltage controlled delay line and a first phase detector.

18. The circuit of claim 16 wherein the second delay locked loop includes a second voltage controlled delay line and second phase detector.

19. The circuit of claim 16 wherein the third delay locked loop includes a third voltage controlled delay line and third phase detector.

20. The circuit of claim 16 wherein the third clock signal is generated by an edge triggered latch.

* * * * *

UNITED STATES PATENT AND TRADEMARK OFFICE
CERTIFICATE OF CORRECTION

PATENT NO. : 7,474,136 B2  Page 1 of 1
APPLICATION NO. : 11/745911
DATED : January 6, 2009
INVENTOR(S) : John D. Heightley It is certified that error appears in the above-identified patent and that said Letters Patent is hereby corrected as shown below:

Title Page, Item (73) Assignee:

"ProMOS Technologies Pte.Ltd.," should be --ProMOS Technologies PTE.Ltd.,--

Signed and Sealed this

Seventeenth Day of March, 2009

JOHN DOLL
*Acting Director of the United States Patent and Trademark Office*